US012604552B2

(12) United States Patent
Chen et al.

(10) Patent No.: US 12,604,552 B2
(45) Date of Patent: Apr. 14, 2026

(54) CONTACT ETCH STOP LAYER FOR A PIXEL SENSOR

(71) Applicant: Taiwan Semiconductor Manufacturing Company, Ltd., Hsinchu (TW)

(72) Inventors: Cheng-Hsien Chen, Tainan City (TW); Yung-Hsiang Chen, Tainan City (TW); Chia Hao Li, Tainan City (TW); Yu-Lung Yeh, Kaohsiung City (TW); Yen-Hsiu Chen, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 622 days.

(21) Appl. No.: 17/446,558

(22) Filed: Aug. 31, 2021

(65) Prior Publication Data

US 2023/0063670 A1     Mar. 2, 2023

(51) Int. Cl.
H10F 39/00          (2025.01)

(52) U.S. Cl.
CPC ......... H10F 39/807 (2025.01); H10F 39/011 (2025.01)

(58) Field of Classification Search
CPC ............................. H10F 39/807; H10F 39/011
See application file for complete search history.

(56) References Cited

U.S. PATENT DOCUMENTS

| | | | | |
|---|---|---|---|---|
| 10,651,332 B2 * | 5/2020 | Moussy | ................ | H10F 77/148 |
| 2005/0116290 A1 * | 6/2005 | de Souza | .......... | H01L 21/76275 |
| | | | | 257/E21.415 |
| 2007/0077765 A1 * | 4/2007 | Prince | .................. | H10D 64/017 |
| | | | | 438/694 |
| 2007/0164357 A1 * | 7/2007 | Clevenger | .............. | H10D 86/01 |
| | | | | 257/E21.703 |
| 2014/0312449 A1 * | 10/2014 | Jonak-Auer | ...... | H01L 27/14689 |
| | | | | 257/438 |

(Continued)

FOREIGN PATENT DOCUMENTS

| | | | | | |
|---|---|---|---|---|---|
| CN | 109690792 A | | 4/2019 | | |
| CN | 113097346 A | * | 7/2021 | ........... | H10F 71/121 |
| GB | 2370416 A | * | 6/2002 | ........... | H10D 64/671 |

OTHER PUBLICATIONS

Wang et al.*

*Primary Examiner* — Ali Naraghi
(74) *Attorney, Agent, or Firm* — Harrity & Harrity, LLP

(57) ABSTRACT

One or more semiconductor processing tools may deposit a contact etch stop layer on a substrate. In some implementations, the contact etch stop layer is comprised of less than approximately 12 percent hydrogen. Depositing the contact etch stop layer may include depositing contact etch stop layer material at a temperature of greater than approximately 600 degrees Celsius, at a pressure of greater than approximately 150 torr, and/or with a ratio of at least approximately 70:1 of NH3 and SiH4, among other examples. The one or more semiconductor processing tools may deposit a silicon-based layer above the contact etch stop layer. The one or more semiconductor processing tools may perform an etching operation into the silicon-based layer until reaching the contact etch stop layer to form a trench isolation structure.

20 Claims, 11 Drawing Sheets

200

(56) References Cited

U.S. PATENT DOCUMENTS

2014/0349448 A1 * 11/2014 Afzali-Ardakani ......................... H10D 86/411
                                                                438/127
2016/0172404 A1 * 6/2016 Ahmed ................. H10F 39/014
                                                 257/459

* cited by examiner

200

300

204
202

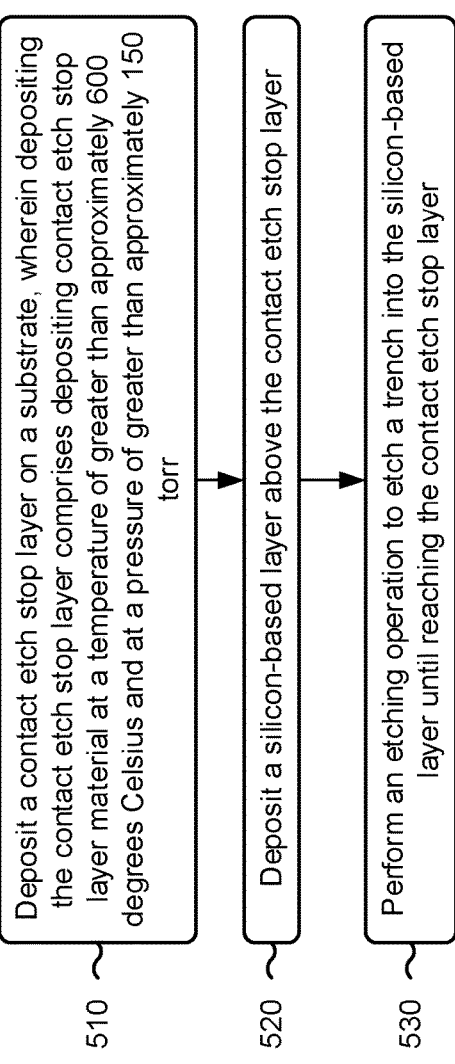

510   Deposit a contact etch stop layer on a substrate, wherein depositing the contact etch stop layer comprises depositing contact etch stop layer material at a temperature of greater than approximately 600 degrees Celsius and at a pressure of greater than approximately 150 torr 520   Deposit a silicon-based layer above the contact etch stop layer 530   Perform an etching operation to etch a trench into the silicon-based layer until reaching the contact etch stop layer

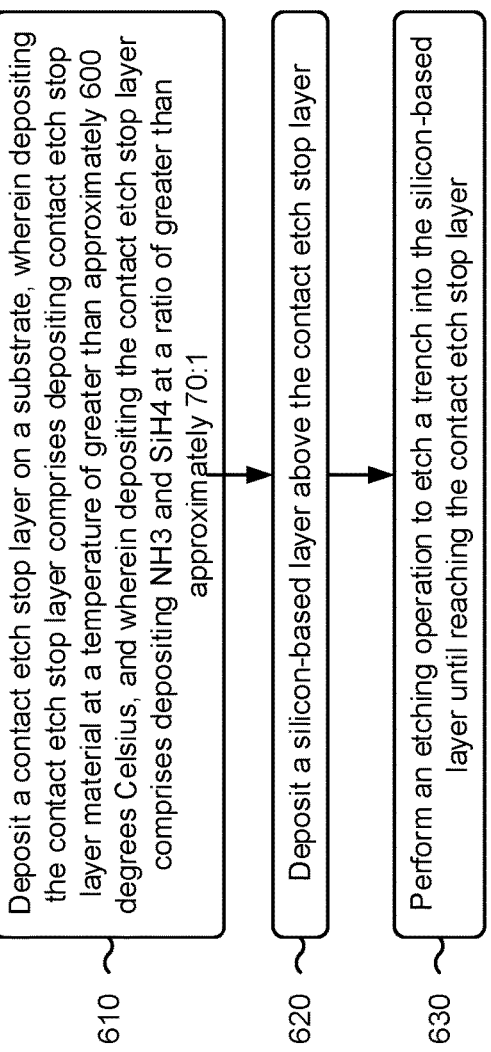

610    Deposit a contact etch stop layer on a substrate, wherein depositing the contact etch stop layer comprises depositing contact etch stop layer material at a temperature of greater than approximately 600 degrees Celsius, and wherein depositing the contact etch stop layer comprises depositing NH3 and SiH4 at a ratio of greater than approximately 70:1

620    Deposit a silicon-based layer above the contact etch stop layer

630    Perform an etching operation to etch a trench into the silicon-based layer until reaching the contact etch stop layer

CONTACT ETCH STOP LAYER FOR A PIXEL SENSOR

BACKGROUND

Complementary metal oxide semiconductor (CMOS) image sensors utilize light-sensitive CMOS circuitry, referred to as pixel sensors, to convert light energy into electrical energy. A pixel sensor typically includes a photodiode formed in a silicon substrate. As the photodiode is exposed to light, an electrical charge is induced in the photodiode. Sampling of the electrical charge in the photodiode may be used to generate a digital image.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5 and 6 are flowcharts of example processes relating to an etch stop layer with low-hydrogen concentration.

DETAILED DESCRIPTION

Figure 1:
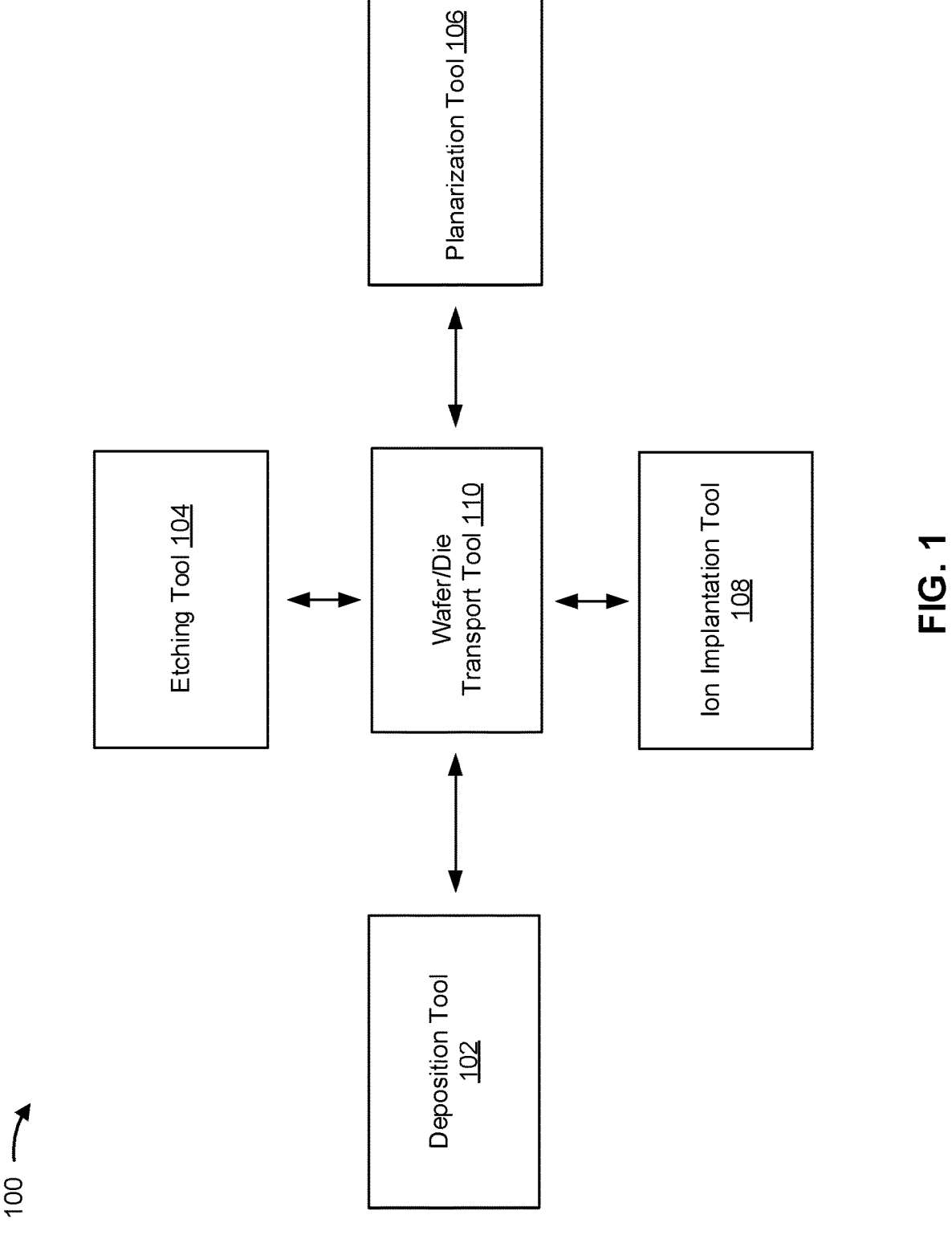
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A pixel sensor of a complementary metal oxide semiconductor (CMOS) image sensor may include a trench isolation structure (e.g., a deep trench isolation (DTI) structure) around a photodiode. To assist in an etching operation to form the trench isolation structure, the pixel sensor may be formed with a contact etch stop layer (CESL) below the photodiode. The etching operation may include etching through a silicon-based layer (e.g., a pixel sensor substrate) until detecting the CESL. In this way, an etching tool may control a depth of the etching process and/or may control how many layers of material are removed during the etching operation.

However, the etch stop layer (e.g., a silicon-nitride material) may have a relatively high concentration of hydrogen (>15% of atoms). When light enters the pixel sensor (e.g., during an image capture operation), some electrons may become trapped within the CESL based on the relatively high concentration of hydrogen. The CESL may release trapped electrons, which may induce a charge within the pixel sensor and cause a ghost image effect (e.g., a residual image caused by a release of the trapped electrons from the CESL that induces an electrical charge of the pixel sensor). This may cause distorted imaging from the CMOS image sensor.

Some implementations described herein provide techniques and apparatuses for a low-hydrogen concentration CESL disposed below a silicon-based layer (e.g., including a photodiode) of a pixel sensor. The low-hydrogen concentration CESL may include less than approximately 12 percent hydrogen (e.g., based on a percentage of atoms within the contact etch stop layer that are hydrogen atoms). In some implementations, the low-hydrogen concentration CESL may include at least approximately 70 percent silicon and nitrogen.

The low-hydrogen concentration CESL may capture a reduced amount of electrons when light enters the photodiode of the pixel sensor, which may reduce (or eliminate) a ghost image effect when capturing an image using the pixel sensor. This improves a digital image generated based on sampling of an electrical charge of the photodiode of the pixel sensor.

To further reduce a ghost image effect, the photodiode portion of the pixel sensor may have an upper surface with angles in a range of approximately 80 degrees to approximately 100 degrees. In some implementations, the angles may be approximately 90 degrees and/or the upper surface may be generally rectangular-shaped. In this way, a photon may have an increased likelihood of exiting the photodiode based on a decreased likelihood of having an angle of incidence with a surface of the diode that causes total internal reflection within the diode. Additionally, or alternatively, a reduced amount of electrical charge may be induced within the pixel sensor upon release of captured electrons. In this way, the pixel sensor may reduce (or eliminate) a ghost image effect when capturing an image using the pixel sensor.

FIG. 1 is a diagram of an example environment 100 in which systems and/or methods described herein may be implemented. As shown in FIG. 1, environment 100 may include a plurality of semiconductor processing tools 102-108 and a wafer/die transport tool 110. The plurality of semiconductor processing tools 102-108 may include a deposition tool 102, an etching tool 104, a planarization tool 106, an ion implantation tool 108, and/or other tools. The semiconductor tools included in example environment 100 may be included in a semiconductor clean room, a semiconductor foundry, a semiconductor foundry, a semiconductor processing and/or manufacturing facility, or another location.

A deposition tool 102 is a semiconductor processing tool that is capable of depositing various types of materials onto a substrate. In some implementations, a deposition tool 102 includes a spin coating tool that is capable of depositing a photoresist layer on a substrate such as a wafer. In some implementations, a deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, a deposition tool 102 includes a physical vapor deposition (PVD) tool, such as a sputtering tool or another type of PVD tool. In some implementations, the example environment 100 includes a plurality of types of deposition tools 102.

A deposition tool 102 may include a deposition chamber having a temperature and/or pressure that can be modified for a deposition operation. In some implementations, the deposition tool 102 may heat and/or pressurize the deposition chamber in preparation for deposition of a layer of material on a wafer. For example, the deposition tool 102 may heat the deposition chamber to at least approximately 600 degrees Celsius and/or pressurize the deposition chamber to at least approximately 150 torr in preparation for deposition of a CESL on a substrate, as described herein.

An etching tool 104 is a semiconductor processing tool that is capable of etching various types of materials of a substrate, wafer, or semiconductor device. For example, the etching tool 104 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of a the substrate using a sputtering technique, a plasma-assisted etch technique (e.g., a plasma sputtering technique or another type of technique involving the use of an ionized gas to isotopically or directionally etch the one or more portions), or another type of dry etching technique.

The etching tool 104 (e.g., a dry etching tool) may perform an etching operation until detecting a CESL of the wafer or semiconductor device. Detection of the CESL may indicate that the etching operation is complete. The etching tool 104 may perform a subsequent etching operation and/or the wafer/die transport tool 110 may transport the wafer or semiconductor device from the etching tool 104 to another semiconductor processing tool after the etching operation is complete.

The planarization tool 106 is a semiconductor processing tool that is capable of polishing or planarizing various layers of a wafer or semiconductor device. For example, a polishing device may include a chemical mechanical polishing (CMP) device and/or another type of polishing device. In some implementations, a polishing device may polish or planarize a layer of deposited or plated material.

An ion implantation tool 108 is a semiconductor processing tool that is used to implant ions into a substrate such as a wafer or semiconductor device. For example, an ion implantation tool 108 may implant ions into a silicon-based layer of a CMOS image sensor to form a diode. An ion implantation tool 108 generates ions in an arc chamber from a source material such as a gas or a solid. The source material is provided into the arc chamber, and an arc voltage is discharged between a cathode and an electrode to produce a plasma containing ions of the source material. One or more extraction electrodes are used to extract the ions from the plasma in the arc chamber and accelerate the ions to form an ion beam. The ion beam may be directed toward the substrate such that the ions are implanted below the surface of the substrate to dope the substrate.

Wafer/die transport tool 110 includes a mobile robot, a robot arm, a tram or rail car, an overhead hoist transfer (OHT) vehicle, an automated material handling system (AMHS), and/or another type of tool that is used to transport wafers and/or dies between semiconductor processing tools 102-108 and/or to and from other locations such as a wafer rack, a storage room, or another location. In some implementations, wafer/die transport tool 110 may be a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2A:
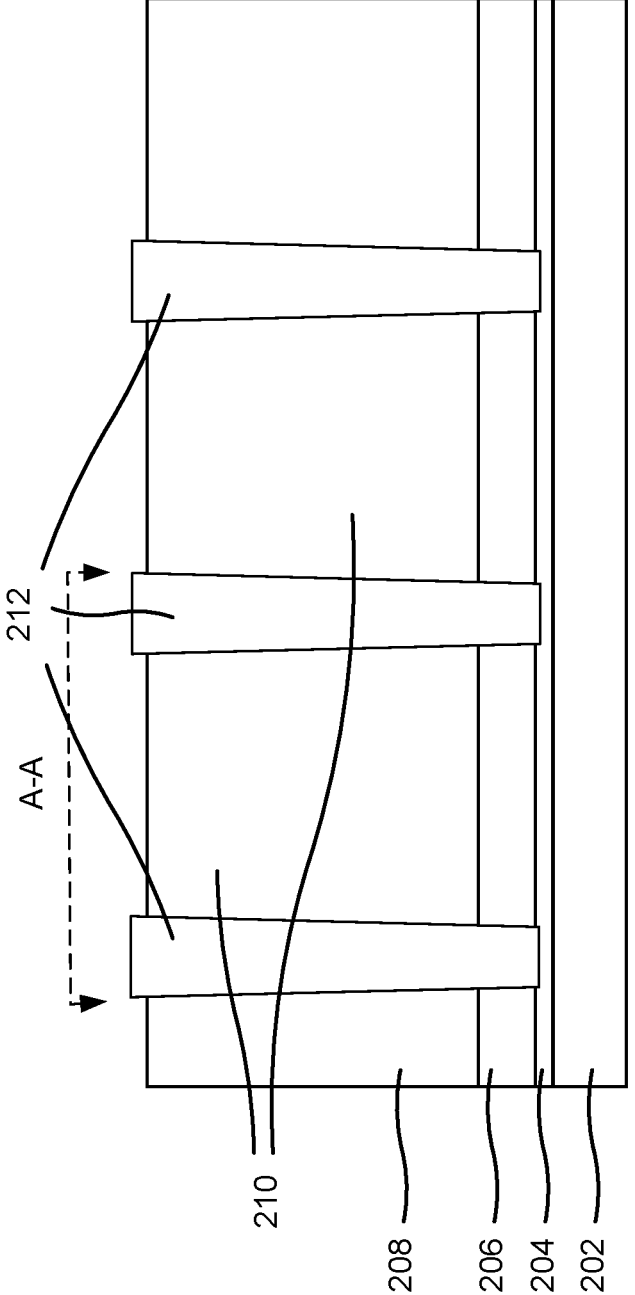
FIGS. 2A and 2B are diagrams of an example semiconductor structure described herein.
Figure 2B:
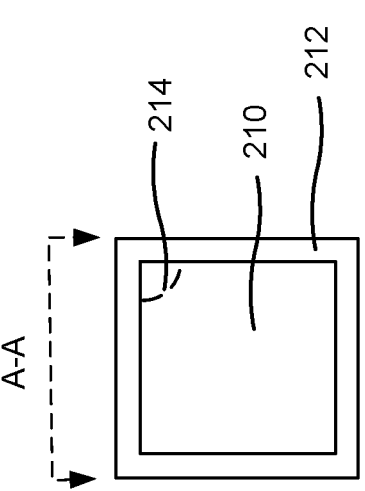

FIGS. 2A and 2B are diagrams of an example semiconductor structure 200 described herein. FIG. 2A shows a cross section of a side the semiconductor structure 200. FIG. 2B shows a top view of the semiconductor structure 200. The semiconductor structure 200 may include, or may be included in, a pixel sensor and/or an image sensor. The image sensor may be a CMOS image sensor, a backside illumination (BSI) CMOS image sensor, or another type of image sensor.

As shown in FIG. 2A, the semiconductor structure 200 may include a substrate 202 and a CESL 204 disposed on the substrate 202. The semiconductor structure 200 may further include a dielectric layer 206 disposed on the CESL 204 and/or a silicon-based layer 208 disposed above the CESL (e.g., on the dielectric layer 206 or on the CESL 204, among other examples). The silicon-based layer 208 may include one or more photodiodes 210 separated by one or more trench isolation structures 212 disposed through the silicon-based layer 208 to the CESL 204.

The substrate 202 may include a dielectric material. For example, the substrate 202 may include an inter-metal dielectric layer. The inter-metal dielectric layer may include bonding pads and/or other metal interconnecting structures that connect the semiconductor structure 200 to a package, to external electrical connections, and/or to other external devices. The substrate 202 may include a low-k material, such as silicon dioxide, fluorinated silicate glass, hydrogen silsesquioxane, methyl silsesquioxane, organo silicate glass, and/or an organic aromatic polymer, among other examples.

Similar to the substrate 202, the dielectric layer 206 may include a low-k material, such as silicon dioxide, fluorinated silicate glass, hydrogen silsesquioxane, methyl silsesquioxane, organo silicate glass, and/or an organic aromatic polymer, among other examples. The dielectric layer 206 may provide electrical and/or optical isolation between the substrate 202 and the silicon-based layer 208. The dielectric layer 206 may include an inter-layer dielectric.

In some implementations, the CESL 204 may be disposed between the substrate 202 and the dielectric layer 206. In some implementations, the CESL 204 may be disposed between the dielectric layer 206 and the silicon-based layer 208. The CESL 204 may have a thickness in a range from approximately 10 nanometers to approximately 100 nanometers. In this way, the CESL 204 may be sufficiently thick to use as a CESL (e.g., without failing to detect the CESL during etching based on being too thin) and sufficiently thin to reduce an amount of hydrogen atoms that penetrate the CESL 204 during deposition of the CESL 204.

The CESL 204 may include materials based on nitrogen, silicon, hydrogen, and/or oxygen. The CESL 204 may be comprised of less than approximately 12 percent (e.g., 0 percent to 12 percent) hydrogen. For example, the CESL 204 may be comprised of less than approximately 12 percent hydrogen based on a percentage of atoms within the CESL 204 that are hydrogen atoms. The CESL 204 may be comprised of at least approximately 65 percent nitrogen and silicon. In some implementations, the CESL 204 may be comprised of at least 65 percent of 14 nitrogen isotope and 28 silicon isotope. The nitrogen and silicon may form a silicon nitride-based material. In some implementations, a portion of the nitrogen may bond with hydrogen atoms, which may cause the hydrogen to remain in the CESL 204.

Based on the CESL 204 being comprised of less than approximately 12 percent hydrogen, the CESL 204 may capture a reduced amount of electrons when light enters the photodiodes 210. This may reduce (or eliminate) a ghost image effect when capturing an image using the semiconductor structure 200. A reduced ghost image effect improves a digital image generated based on sampling of an electrical charge of the photodiodes 210 of the semiconductor structure 200.

The silicon-based layer 208 may include a silicon substrate, a substrate formed of a material including silicon, a III-V compound semiconductor substrate such as gallium arsenide (GaAs) substrate, a silicon on insulator (SOI) substrate, or another type of substrate that is capable of generating a charge from photons of incident light.

The photodiodes 210 may be formed within the silicon-based layer 208. For example, the photodiodes 210 may be portions of the silicon-based layer 208 that have been doped to form photodiodes 210 for one or more pixel sensors. The silicon-based material may be doped with a plurality of types of ions to form a p-n junction for each photodiode 210. For example, the silicon-based layer 208 may be doped with an n-type dopant to form a first portion (e.g., an n-type portion) of a photodiode 210 and a p-type dopant to form a second portion (e.g., a p-type portion) of the photodiode 210. In some implementations, another technique is used to form the photodiodes 210, such as diffusion.

The trench isolation structures 212 (e.g., DTI structures) may be formed in the silicon-based layer 208 and/or in the dielectric layer 206. The trench isolation structures 212 may be formed between adjacent photodiodes 210 and/or surrounding (e.g., fully or partially) each photodiode 210, among other examples. In some implementations, the trench isolation structures 212 may be backside trench isolation structures (e.g., backside DTI structures) formed in a backside of the silicon-based layer 208. The trench isolation structures 212 may be filled with an oxide-based material. For example, the trench isolation structures 212 may be filled with a silicon oxide ($SiO_x$) or another type of oxide-based material to provide electrical and/or optical isolation between photodiodes 210. The trench isolation structures 212 may include trenches (e.g., deep trenches) that extend downward into the silicon-based layer 208 along the photodiodes 210. The trench isolation structures 212 may provide optical isolation between the photodiodes 210 of the semiconductor structure 200 to reduce an amount of optical crosstalk between adjacent photodiodes 210 and/or pixel sensors. In particular, trench isolation structures 212 may absorb, refract, and/or reflect incident light, which may reduce the amount of incident light that travels through a photodiode 210 into an adjacent photodiode and is absorbed by the adjacent photodiode 210.

As shown in FIG. 2B, an upper surface of a photodiode 210 of the one or more photodiodes 210 may include corners 214. The corners 214 may have angles in a range from approximately 80 degrees to approximately 100 degrees. In some implementations, the corners 214 may have angles of approximately 90 degrees. In some implementations, the upper surface of the photodiode 210 may be generally rectangular-shaped. Based on the upper surface having corners 214 with angles in a range of approximately 80 degrees to approximately 100 degrees (e.g., approximately 90 degrees) and/or having the upper surface generally rectangular-shaped, a photon may have an increased likelihood of exiting the photodiode based on a decreased likelihood of having an angle of incidence with a surface of the diode that causes total internal reflection within the diode. In this way, a reduced amount of electrical charge may be induced within the pixel sensor upon release of captured electrons.

As indicated above, FIGS. 2A and 2B are provided as an example. Other examples may differ from what is described with regard to FIGS. 2A and 2B.

FIGS. 3A-3F are diagrams of an example implementation 300 described herein. Example implementation 300 may be an example process for forming a semiconductor structure 200. The semiconductor structure 200 may include a CMOS image sensor, a BSI CMOS image sensor, or another type of image sensor.

Figure 3A:
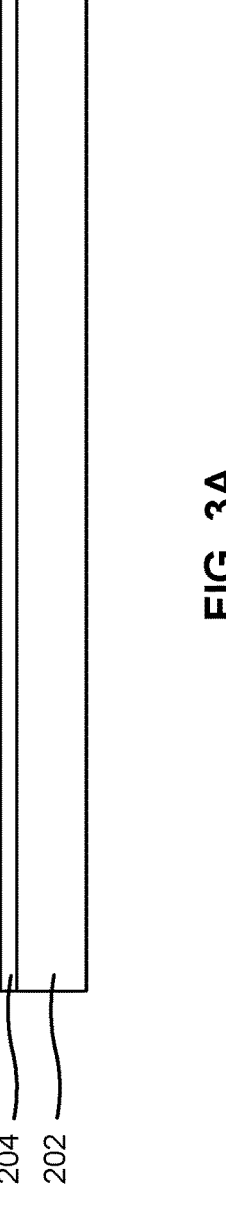
FIGS. 3A-3F are diagrams of an example implementation described herein.

As shown in FIG. 3A, the semiconductor structure 200 may include a substrate 202 and a CESL 204 disposed on the substrate 202. In some implementations, a deposition tool (e.g., deposition tool 102) may deposit the CESL on the substrate 202. In some implementations, the deposition tool may use chemical vapor deposition or physical vapor deposition, among other examples, to deposit CESL 204 on the substrate 202. In some implementations, the deposition tool may deposit CESL material at a temperature of greater than approximately 600 degrees Celsius, and/or at a pressure of greater than approximately 150 torr, among other examples. In some implementations, a temperature that is less than 600 degrees may be used in combination with a pressure that is greater than 150 torr. Similarly, a temperature that is greater than 600 degrees may be used in combination with a pressure that is less than 150 torr. One or more of these deposition techniques may be used to achieve a low-hydrogen concentration CESL 204.

Based on using a temperature of at least approximately 600 degrees Celsius and/or a pressure of at least approximately 150 torr during deposition, atoms within the deposition tool (e.g., within a chamber of the deposition tool) may have sufficient energy to move such that hydrogen may be released from, or excluded from, a deposited layer of the CESL (e.g., including a silicon nitride-based material). Additionally, or alternatively, by using a temperature of at least 600 degrees Celsius and/or a pressure of at least 150 torr during deposition, nitrogen atoms may have an increased likelihood of bonding with silicon atoms instead of bonding with hydrogen atoms. This may allow the hydrogen atoms to form hydrogen gas and escape from a surface of the CESL 204.

Additionally, or alternatively, the deposition tool may deposit the CESL 204 based on providing gas flow of NH3 and SiH4 in a ratio of greater than approximately 70:1. Based on using a ratio of at least approximately 70:1 of NH3 and SiH4, a sufficiently high ratio of nitrogen to silicon may be present to form bonds between nitrogen and silicon atoms to the exclusion of hydrogen atoms within the CESL. Hydrogen atoms may be prevented from penetrating the CESL and/or may be released as hydrogen gas. The hydrogen gas may be vented from the deposition tool.

In some implementations, the CESL 204 may include less than approximately 12 percent hydrogen based on the deposition techniques described. For example, the CESL 204 may include less than 15 percent hydrogen, about 10 percent hydrogen, or less than 12 percent hydrogen, among other examples. The CESL 204 may include less than approximately 12 percent hydrogen based on a percentage of atoms within the CESL 204 that are hydrogen atoms. In some implementations, the CESL 204 may include materials based on silicon, nitrogen, hydrogen, and/or oxygen, among other examples. In some implementations, based on the deposition techniques described, the CESL 204 may include at least approximately 70 percent nitrogen and silicon (e.g., based on a percentage of atoms within the CESL 204 that are nitrogen or silicon atoms).

In some implementations, a planarization tool (e.g., planarization tool 106) may planarize an upper surface of the substrate 202 and/or the CESL 204. In this way, upper surfaces of the substrate and/or the CESL 204 may be generally level and/or a thickness of the CESL 204 may be generally uniform within the pixel area.

Figure 3B:
Figure 3B:
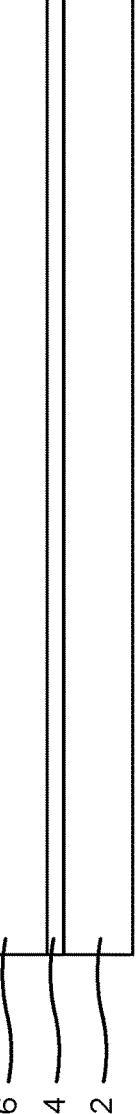
Figure 3B:
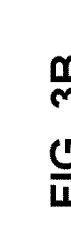

As shown in FIG. 3B, the semiconductor structure 200 may include a dielectric layer 206 disposed on the CESL 204. In some implementations, a deposition tool (e.g., deposition tool 102) may deposit the dielectric layer 206 on the CESL 204. In some implementations, the deposition tool may use chemical vapor deposition or physical vapor deposition, among other examples, to deposit the dielectric layer 206 on the CESL 204. In some implementations, the deposition tool may deposit the dielectric layer 206 to fully cover the CESL 204 within the pixel sensor area of the semiconductor structure 200.

In some implementations, a planarization tool (e.g., planarization tool 106) may planarize an upper surface of the dielectric layer 206. In this way, an upper surface of the dielectric layer 206 may be generally level and/or a thickness of the dielectric layer 206 may be generally uniform within the pixel area.

Figure 3C:
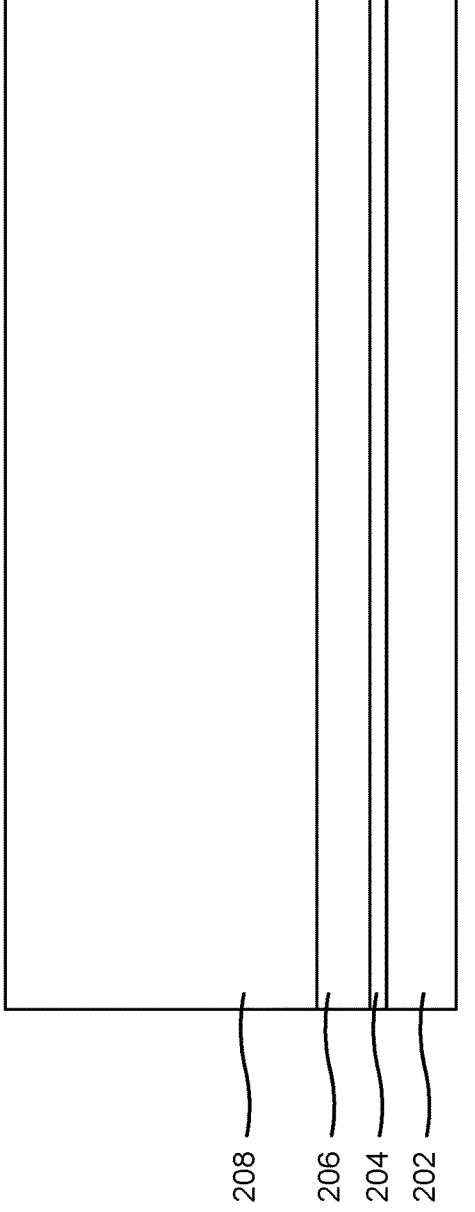

As shown in FIG. 3C, the semiconductor structure 200 may include a silicon-based layer 208 disposed on the dielectric layer 206 and/or above (e.g., in a layer that is above, but not necessarily directly above or directly on) the CESL 204. In some implementations, a deposition tool (e.g., deposition tool 102) may deposit the silicon-based layer 208 on the dielectric layer 206 and/or above the CESL 204. In some implementations, the deposition tool may use chemical vapor deposition or physical vapor deposition, among other examples, to deposit the silicon-based layer 208 on the dielectric layer 206 and/or above the CESL 204. In some implementations, the deposition tool may deposit the silicon-based layer 208 to fully cover the dielectric layer 206 and/or the CESL 204 within the pixel sensor area of the semiconductor structure 200.

In some implementations, a planarization tool (e.g., planarization tool 106) may planarize an upper surface of the silicon-based layer 208. In this way, an upper surface of the silicon-based layer 208 may be generally level and/or a thickness of the silicon-based layer 208 may be generally uniform within the pixel area. In this way, one or more photodiodes formed within the silicon-based layer 208 may have thicknesses that are approximately equal, and sampling of one or more photodiodes of the semiconductor structure 200 may be consistent.

In some implementations, the semiconductor structure 200 may omit the dielectric layer 206 such that the silicon-based layer 208 is disposed on (e.g., directly on) the CESL 204. In some implementations, the deposition tool may deposit the CESL 204 between the dielectric layer 206 and the silicon-based layer 208.

Figure 3D:
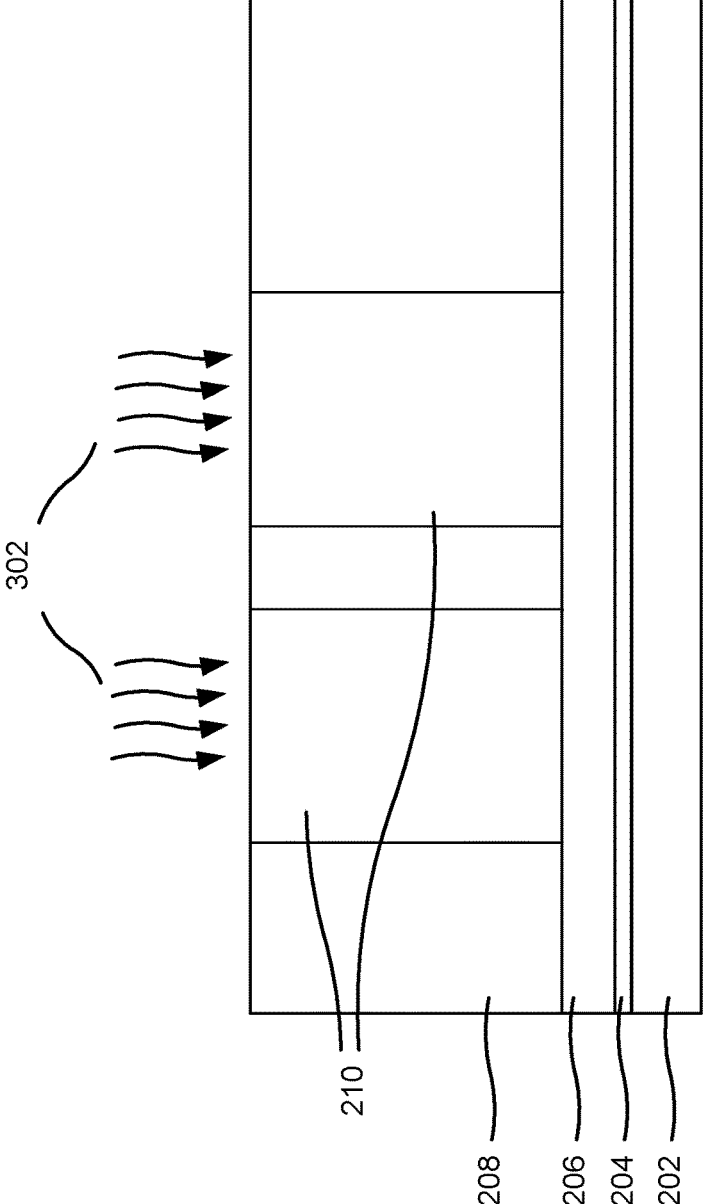

As shown in FIG. 3D, the semiconductor structure 200 may include photodiodes 210 within the silicon-based layer 208. In some implementations, an ion implantation tool (e.g., ion implantation tool 108) may dope portions of the silicon-based layer 208 using an ion implantation technique to form the photodiodes 210 for a plurality of pixel sensors. The silicon-based layer 208 may be doped with a plurality of types of ions to form a p-n junction for each photodiode 210. For example, the silicon-based layer 208 may be doped with an n-type dopant to form a first portion (e.g., an n-type portion) of a photodiode 210 and a p-type dopant to form a second portion (e.g., a p-type portion) of the photodiode 210. In some implementations, another technique is used to form the photodiodes 210, such as diffusion.

Figure 3E:
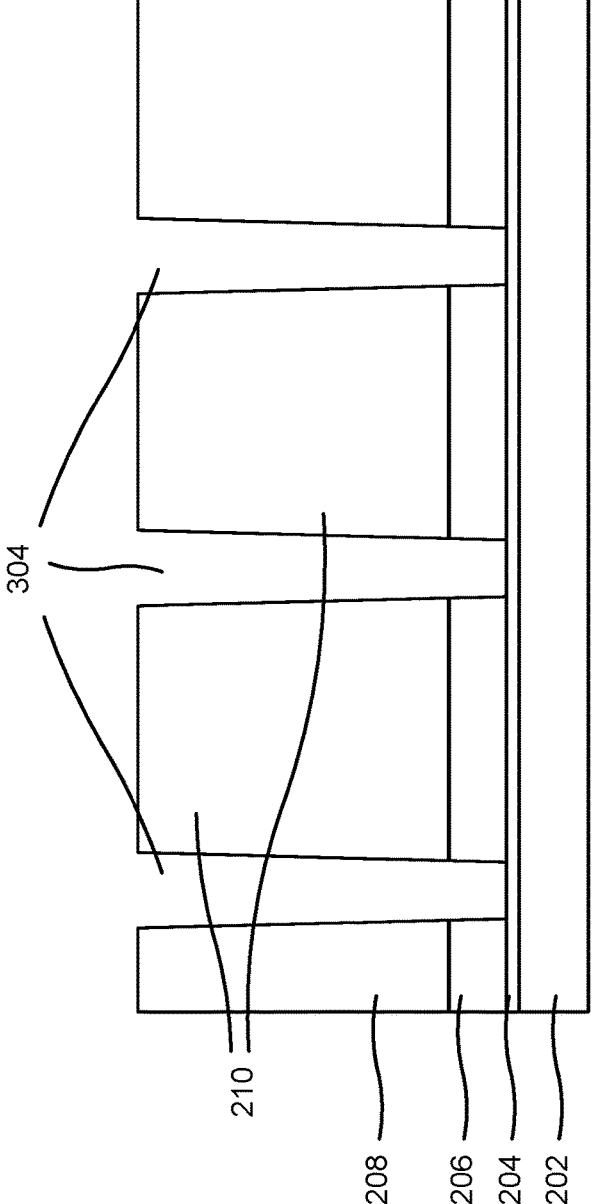

As shown in FIG. 3E, the semiconductor structure 200 may include one or more trenches 304 formed between photodiodes 210. In some implementations, an etching tool (e.g., etching tool 104) may etch a portion of the silicon-based layer 208 and/or the dielectric layer 206 to form one or more trenches 304. In some implementations, the etching tool may use a CESL-based etching process in which the etching tool performs an etching operation until detecting the CESL 204. For example, the etching tool may begin etching multiple portions of the silicon-based layer 208 (e.g., between the photodiodes 210). The etching tool may continue etching until detecting the CESL 204. In this way, the etching tool may remove material of the silicon-based layer 208 and/or the dielectric layer 206, but may stop removing material before reaching the substrate 202.

In some implementations, the operations shown in FIG. 3D and FIG. 3E may be reversed. For example, the etching tool may etch the portion of the silicon-based layer 208 and/or the dielectric layer 206 to form the one or more trenches 304 before the ion implantation tool dopes portions of the silicon-based layer 208.

Figure 3F:
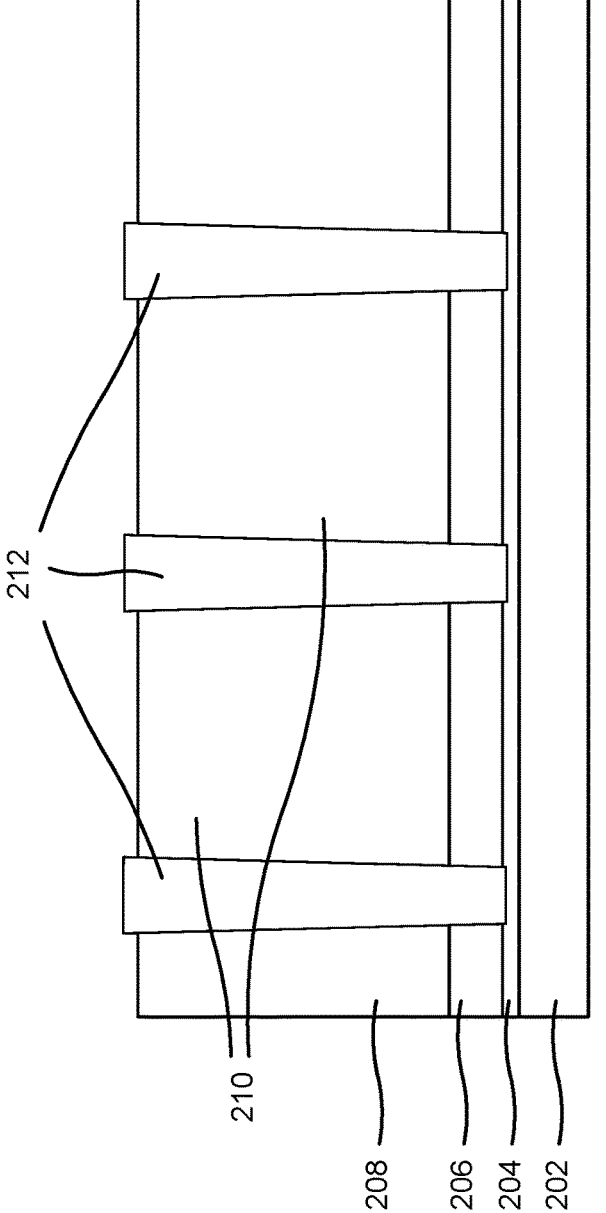

As shown in FIG. 3F, the semiconductor structure 200 may include trench isolation structures 212 (e.g., DTI structures) within the one or more trenches 304 (e.g., formed between photodiodes 210). In some implementations, a deposition tool (e.g., deposition tool 102) may deposit trench isolation material into the one or more trenches 304 to provide deep trench isolation (DTI) for isolate adjacent photodiodes 210. In some implementations, the deposition tool may use chemical vapor deposition or physical vapor deposition, among other examples, to deposit the trench isolation material into the one or more deep trenches of the substrate 202. In some implementations, a planarization tool (e.g., planarization tool 106) may planarize an upper surface of the trench isolation structure 212 and/or the photodiodes 210.

As indicated above, FIGS. 3A-3F are provided as an example. Other examples may differ from what is described with regard to FIGS. 3A-3F. The number and arrangement of devices, layers, and/or materials shown in FIGS. 3A-3F are provided as an example. In practice, there may be additional devices, layers, and/or materials, fewer devices, layers, and/or materials, different devices, layers, and/or materials, or differently arranged devices, layers, and/or materials than those shown in FIGS. 3A-3F. For example, one or more additional operations may be performed to form one or more additional portions of the semiconductor structure 200. For example, one or more semiconductor tools may perform one or more additional operations to form a metal shield region, a bonding pad region, and/or a measurement region of the semiconductor structure 200, among other examples.

Figure 4:
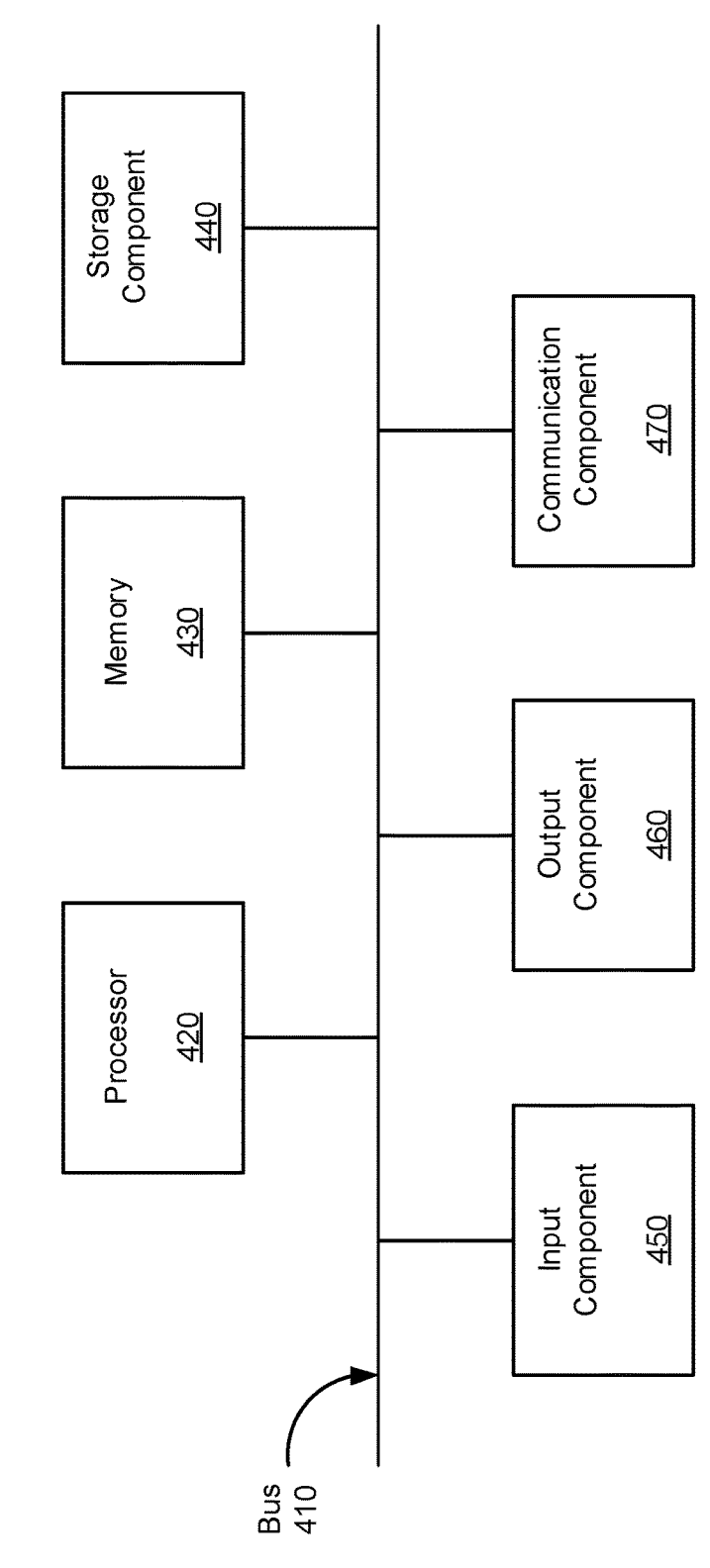
FIG. 4 is a diagram of example components of one or more devices of FIG. 1.

FIG. 4 is a diagram of an example makeup 400 of a CESL with low-hydrogen concentration used in a pixel sensor, as described herein. The CESL may be formed using one or more techniques described herein to reduce hydrogen concentration of the CESL. As shown in FIG. 4, the CESL may include nitrogen atoms (e.g., 14 N), silicon atoms (e.g., 28 Si), hydrogen atoms, and/or oxygen atoms, among other example materials. As shown further shown in FIG. 4, nitrogen atoms may make up approximately 40 percent of the CESL up to a depth of approximately 40 nanometers, silicon may make up approximately 30 percent of the CESL up to a depth of approximately 40 nanometers, hydrogen may make up approximately 11 percent of the CESL up to a depth of approximately 30 nanometers, and/or oxygen may make up less than approximately 5 percent of the CESL up to a depth of approximately 30 nanometers.

Based on the CESL having a low-hydrogen concentration (e.g., less than approximately 12 percent of atoms of the CESL), the CESL may capture a reduced amount of electrons when light enters a photodiode of the pixel sensor, which reduces a ghost image effect when capturing an image using the pixel sensor. This improves a digital image generated based on sampling of an electrical charge of the photodiode of the pixel sensor.

As indicated above, FIG. 4 is provided as an example. Other examples may differ from what is described with regard to FIG. 4. For example, different materials than those shown in FIG. 4 and/or other concentrations of the materials than those shown in FIG. 4 may form the CESL.

FIG. 4 is a diagram of example components of a device 400, which may correspond to deposition tool 102, etching tool 104, planarization tool 106, ion implantation tool 108, and/or wafer/die transport tool 110. In some implementations, deposition tool 102, etching tool 104, planarization tool 106, ion implantation tool 108, and/or wafer/die transport tool 110 may include one or more devices 400 and/or one or more components of device 400. As shown in FIG. 4, device 400 may include a bus 410, a processor 420, a memory 430, a storage component 440, an input component 450, an output component 460, and a communication component 470.

Bus 410 includes a component that enables wired and/or wireless communication among the components of device 400. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform a function. Memory 430 includes a random access memory, a read only memory, and/or another type of memory (e.g., a flash memory, a magnetic memory, and/or an optical memory).

Storage component 440 stores information and/or software related to the operation of device 400. For example, storage component 440 may include a hard disk drive, a magnetic disk drive, an optical disk drive, a solid state disk drive, a compact disc, a digital versatile disc, and/or another type of non-transitory computer-readable medium. Input component 450 enables device 400 to receive input, such as user input and/or sensed inputs. For example, input component 450 may include a touch screen, a keyboard, a keypad, a mouse, a button, a microphone, a switch, a sensor, a global positioning system component, an accelerometer, a gyroscope, and/or an actuator. Output component 460 enables device 400 to provide output, such as via a display, a speaker, and/or one or more light-emitting diodes. Communication component 470 enables device 400 to communicate with other devices, such as via a wired connection and/or a wireless connection. For example, communication component 470 may include a receiver, a transmitter, a transceiver, a modem, a network interface card, and/or an antenna.

Device 400 may perform one or more processes described herein. For example, a non-transitory computer-readable medium (e.g., memory 430 and/or storage component 440) may store a set of instructions (e.g., one or more instructions, code, software code, and/or program code) for execution by processor 420. Processor 420 may execute the set of instructions to perform one or more processes described herein. In some implementations, execution of the set of instructions, by one or more processors 420, causes the one or more processors 420 and/or the device 400 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

FIG. 5 is a flowchart of an example process 600 associated with a CESL with low-hydrogen concentration for a pixel sensor. In some implementations, one or more process blocks of FIG. 5 may be performed by one or more semiconductor processing tools (e.g., deposition tool 102, etching tool 104, planarization tool 106, ion implantation tool 108, and/or wafer/die transport tool 110). Additionally, or alternatively, one or more process blocks of FIG. 5 may be performed by one or more components of device 400, such as processor 420, memory 430, storage component 440, input component 450, output component 460, and/or communication component 470.

As shown in FIG. 5, process 600 may include depositing a CESL on a substrate, wherein depositing the CESL comprises depositing CESL material at a temperature of greater than approximately 600 degrees Celsius and at a pressure of greater than approximately 150 torr (block 510). For example, the one or more semiconductor processing tools may deposit a CESL 204 on a substrate 202, as described above. In some implementations, depositing the CESL 204 comprises depositing CESL material at a temperature of greater than approximately 600 degrees Celsius and at a pressure of greater than approximately 150 torr.

As further shown in FIG. 5, process 600 may include depositing a silicon-based layer above the CESL (block 520). For example, the one or more semiconductor processing tools may deposit a silicon-based layer 208 above the CESL 204, as described above.

As further shown in FIG. 5, process 600 may include performing an etching operation into the silicon-based layer until reaching the CESL to form a trench isolation structure (block 530). For example, the one or more semiconductor processing tools may perform an etching operation into the silicon-based layer until reaching the CESL 204 to form a trench isolation structure 212, as described above.

Process 600 may include additional implementations, such as any single implementation or any combination of implementations described below and/or in connection with one or more other processes described elsewhere herein.

In a first implementation, process 600 includes forming a photodiode between one or more trench isolation structures within the silicon-based layer.

In a second implementation, alone or in combination with the first implementation, performing the etching operation comprises forming the trench isolation structure around a portion of the silicon-based layer, wherein an upper surface of the portion of the silicon-based layer comprises multiple corners having angles in a range from approximately 80 degrees and 100 degrees.

In a third implementation, alone or in combination with one or more of the first and second implementations, performing the etching operation comprises forming the trench isolation structure around a portion of the silicon-based layer, wherein the portion of the silicon-based layer has an upper surface that is generally rectangular-shaped.

In a fourth implementation, alone or in combination with one or more of the first through third implementations, depositing the CESL comprises providing gas flow of NH3 and SiH4 in a ratio of greater than approximately 70:1.

In a fifth implementation, alone or in combination with one or more of the first through fourth implementations, the CESL is comprised of less than approximately 12 percent hydrogen based on a percentage of atoms within the CESL 204 that are hydrogen atoms.

In a sixth implementation, alone or in combination with one or more of the first through fifth implementations, the CESL comprises a silicon nitride-based material.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

FIG. 6 is a flowchart of an example process 600 associated with a CESL with low-hydrogen concentration for a pixel sensor. In some implementations, one or more process blocks of FIG. 6 may be performed by a one or more semiconductor processing tools (e.g., deposition tool 102, etching tool 104, planarization tool 106, ion implantation tool 108, and/or wafer/die transport tool 110). Additionally, or alternatively, one or more process blocks of FIG. 6 may be performed by one or more components of device 400, such as processor 420, memory 430, storage component 440, input component 450, output component 460, and/or communication component 470.

As shown in FIG. 6, process 600 may include depositing a CESL on a substrate, wherein depositing the CESL comprises depositing CESL material at a temperature of greater than approximately 600 degrees Celsius, and wherein depositing the CESL material comprises depositing NH3 and SiH4 at a ratio of greater than approximately 70:1 (block 610). For example, the one or more semiconductor processing tools may deposit a CESL 204 on a substrate 202, as described above. In some implementations, depositing the CESL 204 comprises depositing CESL material at a temperature of greater than approximately 600 degrees Celsius. In some implementations, the CESL material comprises NH3 and SiH4 at a ratio of greater than approximately 70:1.

As further shown in FIG. 6, process 600 may include depositing a silicon-based layer above the CESL (block 620). For example, the one or more semiconductor processing tools may deposit a silicon-based layer 208 above the CESL 204, as described above.

As further shown in FIG. 6, process 600 may include performing an etching operation to etch a trench, for a trench isolation structure, into the silicon-based layer until reaching the CESL (block 630). For example, the one or more semiconductor processing tools may perform an etching operation to etch a trench 304, for a trench isolation structure 212, into the silicon-based layer 208 until reaching the CESL 204, as described above.

Process 600 may include additional implementations, such as any single implementation or any combination of implementations described below and/or in connection with one or more other processes described elsewhere herein.

In a first implementation, the CESL is comprised of less than approximately 12 percent hydrogen.

In a second implementation, alone or in combination with the first implementation, performing the etching operation comprises forming the trench around a portion of the silicon-based layer, and wherein an upper surface of the portion of the silicon-based layer comprises multiple corners having angles in a range from approximately 80 degrees and 100 degrees.

In a third implementation, alone or in combination with one or more of the first and second implementations, process 600 includes ionizing a portion of the silicon-based layer to form doped silicon-based material, wherein the doped silicon-based material comprises a photodiode that is at least partially surrounded by the trench isolation structure.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, the CESL may include less than approximately 12 percent hydrogen. Based on the CESL including less than approximately 12 percent hydrogen (e.g., less than 15 percent, about 10 percent, among other examples), the CESL may capture a reduced amount of electrons when light enters the photodiodes. This may reduce a ghost image effect when capturing an image using the semiconductor structure. A reduced ghost image effect may improve a digital image generated based on sampling of an electrical charge of the photodiodes of the semiconductor structure.

As described in greater detail above, some implementations described herein provide a pixel sensor. The pixel sensor includes a substrate. The pixel sensor includes a contact etch stop layer disposed on the substrate, where the contact etch stop layer is comprised of less than approximately 12 percent hydrogen. The pixel sensor includes a silicon-based layer disposed above the contact etch stop layer, where the silicon-based layer comprises a photodiode. The pixel sensor includes one or more trench isolation structures disposed through the silicon-based layer to the contact etch stop layer.

As described in greater detail above, some implementations described herein provide a method. The method includes depositing a contact etch stop layer on a substrate, where depositing the contact etch stop layer comprises depositing contact etch stop layer material at a temperature of greater than approximately 600 degrees Celsius and at a pressure of greater than approximately 150 torr. The method includes depositing a silicon-based layer above the contact etch stop layer. The method includes performing an etching operation into the silicon-based layer until reaching the contact etch stop layer to form a trench isolation structure.

As described in greater detail above, some implementations described herein provide a method. The method includes depositing a contact etch stop layer on a substrate, where depositing the contact etch stop layer comprises depositing contact etch stop layer material at a temperature of greater than approximately 600 degrees Celsius, and where the contact etch stop layer material comprises NH3 and SiH4 at a ratio of greater than approximately 70:1. The method includes depositing a silicon-based layer above the contact etch stop layer. The method includes performing an etching operation to etch a trench, for a trench isolation structure, into the silicon-based layer until reaching the contact etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
depositing, based on providing gas flow of nitrogen trihydride (NH3) and silicon tetrahydride (SiH4) in a ratio of greater than approximately 70:1, a contact etch stop layer on a substrate,
  wherein depositing the contact etch stop layer comprises depositing contact etch stop layer material at a temperature of greater than approximately 600 degrees Celsius and at a pressure of greater than approximately 150 torr, and
  wherein the contact etch stop layer comprises less than approximately 12 percent hydrogen based on a percentage of atoms within the contact etch stop layer that are hydrogen atoms;
depositing a silicon-based layer above the contact etch stop layer;
forming a photodiode, having an upper surface with angles in a range of approximately 80 degrees to approximately 100 degrees, within the silicon-based layer; and
performing an etching operation into the photodiode and the silicon-based layer until reaching a portion of the contact etch stop layer to form a trench isolation structure, wherein the portion of the contact etch stop layer is less than an entire thickness of the contact etch stop layer.

14

2. The method of claim 1,
wherein performing the etching operation comprises forming the trench isolation structure around a portion of the silicon-based layer,
  wherein an upper surface of the portion of the silicon-based layer comprises multiple corners having angles in a range from approximately 80 degrees and 100 degrees.

3. The method of claim 1,
wherein performing the etching operation comprises forming the trench isolation structure around a portion of the silicon-based layer,
  wherein the portion of the silicon-based layer has an upper surface that is rectangular-shaped.

4. The method of claim 1,
wherein the contact etch stop layer comprises a silicon nitride-based material.

5. The method of claim 1,
wherein the contact etch stop layer comprises greater than approximately 65 percent nitrogen and silicon.

6. The method of claim 1, wherein the photodiode is at least partially surrounded by the trench isolation structure.

7. A method, comprising:
depositing, based on providing gas flow of nitrogen trihydride (NH3) and silicon tetrahydride (SiH4) in a ratio of greater than approximately 70:1, a contact etch stop layer, comprising less than approximately 12 percent hydrogen, on a substrate,
  wherein depositing the contact etch stop layer comprises depositing contact etch stop layer material at a temperature of greater than approximately 600 degrees Celsius, and
  wherein depositing the contact etch stop layer material comprises depositing NH3 and SiH4 at a ratio of greater than approximately 70:1;
depositing a silicon-based layer above the contact etch stop layer;
forming a photodiode, having an upper surface with angles in a range of approximately 80 degrees to approximately 100 degrees, between within the silicon-based layer; and
performing an etching operation to etch a trench, for a trench isolation structure, into the photodiode and the silicon-based layer until reaching a portion of the contact etch stop layer, wherein the portion of the contact etch stop layer is less than an entire thickness of the contact etch stop layer.

8. The method of claim 7,
wherein performing the etching operation comprises forming the trench around a portion of the silicon-based layer, and
  wherein an upper surface of the portion of the silicon-based layer comprises multiple corners having angles in a range from approximately 80 degrees and 100 degrees.

9. The method of claim 7, further comprising:
ionizing a portion of the silicon-based layer to form a doped silicon-based material.

10. The method of claim 7,
wherein the contact etch stop material is deposited at a pressure of less than approximately 150 torr.

11. The method of claim 7,
wherein performing the etching operation comprises forming the trench isolation structure around a portion of the silicon-based layer,
  wherein the portion of the silicon-based layer has an upper surface that is rectangular-shaped.

12. A method, comprising: depositing, based on providing gas flow of nitrogen trihydride (NH3) and silicon tetrahydride (SiH4) in a ratio of greater than approximately 70:1, a contact etch stop material, with a concentration of less than 12 percent hydrogen, on a substrate; depositing a dielectric layer on the contact etch stop material; depositing a silicon-based layer on the dielectric layer and above the contact etch stop material, wherein the silicon-based layer comprises one or more photodiodes having an upper surface with angles in a range of approximately 80 degrees to approximately 100 degrees; and performing an etching operation to etch one or more trenches, for one or more trench isolation structures, into the photodiodes and the dielectric layer until reaching a portion of the contact etch stop layer, wherein the portion of the contact etch stop layer is less than an entire thickness of the contact etch stop layer.

13. The method of claim 12,
  wherein the contact etch stop material is deposited at a temperature of greater than approximately 600 degrees Celsius.

14. The method of claim 12,
  wherein the contact etch stop material is deposited at a pressure of greater than approximately 150 torr.

15. The method of claim 12,
  wherein the contact etch stop material forms a contact etch material layer comprising at least approximately 70 percent nitrogen and silicon.

16. The method of claim 12,
  wherein the silicon-based layer fully covers the contact etch stop material and the dielectric layer.

17. The method of claim 12,
  wherein the one or more photodiodes are separated by the one or more trench isolation structures.

18. The method of claim 12,
  wherein the contact etch stop layer comprises greater than approximately 65 percent nitrogen and silicon.

19. The method of claim 12, wherein performing the etching operation comprises forming the one or more trench isolation structures around a portion of the silicon-based layer,
  wherein an upper surface of the portion of the silicon-based layer comprises multiple corners having angles in a range from approximately 80 degrees and 100 degrees.

20. The method of claim 12,
  wherein performing the etching operation comprises forming the one or more trench isolation structures around a portion of the silicon-based layer,
    wherein the portion of the silicon-based layer has an upper surface that is rectangular-shaped.

* * * * *